United States Patent [19]

Hiraguchi et al.

[11] Patent Number: 5,094,963
[45] Date of Patent: Mar. 10, 1992

[54] PROCESS FOR PRODUCING A SEMICONDUCTOR DEVICE WITH A BULK-DEFECT REGION HAVING A NONUNIFORM DEPTH

[75] Inventors: Takao Hiraguchi, Mizusawa; Kazunori Imaoka, Komae, both of Japan

[73] Assignee: Fujitsu Limited, Kawasaki, Japan

[21] Appl. No.: 577,511

[22] Filed: Sep. 5, 1990

Related U.S. Application Data

[60] Division of Ser. No. 398,384, Jul. 14, 1982, abandoned, which is a continuation of Ser. No. 777,558, Sep. 18, 1985, abandoned, which is a continuation of Ser. No. 373,591, Jun. 30, 1989, Pat. No. 4,970,568.

[30] Foreign Application Priority Data

Jul. 17, 1981 [JP] Japan .................. 56-111864

[51] Int. Cl.$^5$ .......................................... H01L 21/306
[52] U.S. Cl. .................................... 437/12; 437/11; 437/248; 148/DIG. 24; 148/DIG. 127
[58] Field of Search ............... 437/10, 11, 12, 16, 437/247, 248, 946; 148/DIG. 23, DIG. 24, DIG. 60, DIG. 27

[56] References Cited

U.S. PATENT DOCUMENTS

| | | | |
|---|---|---|---|
| 3,895,965 | 7/1975 | MacRae et al. | 437/11 |
| 3,929,529 | 12/1975 | Poponiak | 437/247 |
| 4,116,719 | 9/1978 | Shimizu et al. | 437/10 |
| 4,220,483 | 9/1980 | Cazcarra | 148/DIG. 23 |
| 4,344,815 | 8/1982 | Cazarra et al. | 148/DIG. 24 |
| 4,376,657 | 3/1983 | Nagasawa et al. | 437/11 |
| 4,417,943 | 11/1983 | Jacques et al. | 156/601 |

OTHER PUBLICATIONS

"Interstial oxygen gettering in Czochralski silicon wafers", Rozgonyi et al., Applied Physics Letters, vol. 31, No. 5, Sep. 1, 1977.

"Gettering ... Silicon Wafers", Rozgonyi et al., Appl. Phys. Lett., vol. 32, No. 11, Jun. 1, 1978.

*Primary Examiner*—Brian E. Hearn
*Assistant Examiner*—C. Chaudhari
*Attorney, Agent, or Firm*—Staas & Halsey

[57] ABSTRACT

The present invention relates to a semiconductor device e.g., a CMOS, comprising a denuded region and a bulk-defect region, as well as a process for producing, e.g., CMOS. In a conventional CMOS, the distance (dp) between the bulk-defect region and p$^+$-type source or drain region (dp) is greater than the distance (dn) between the bulk-defect region and the p well (dn). As a result, a leakage current can be generated in the PN juction. In order to eliminate the problems caused due to dp > dn, the present invention forms in a semiconductor substrate a bulk-defect region having a depth which is nonuniform in accordance with the nonuniform depth of the semiconductor elements.

9 Claims, 9 Drawing Sheets

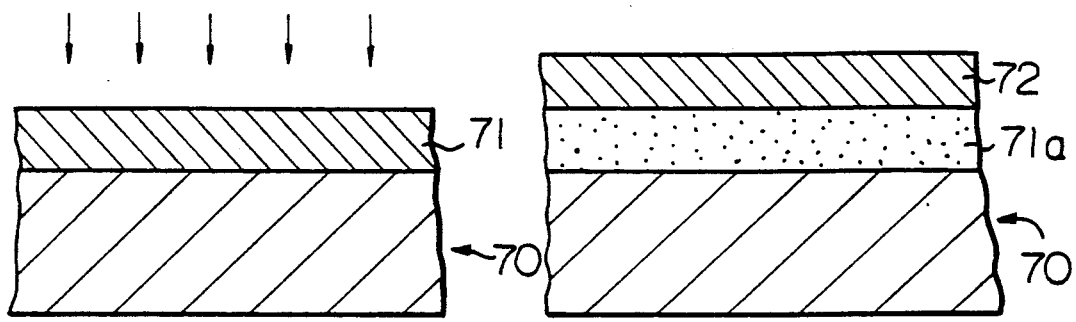
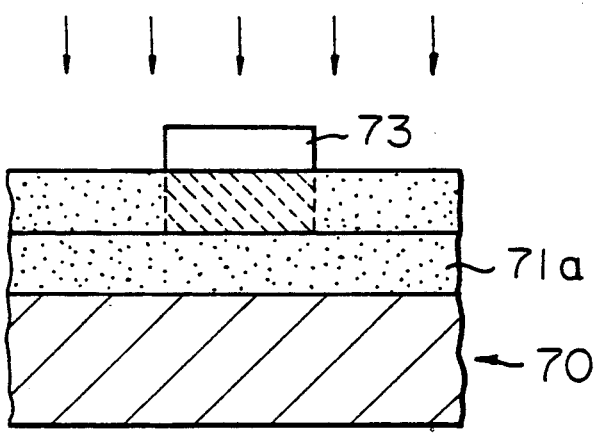
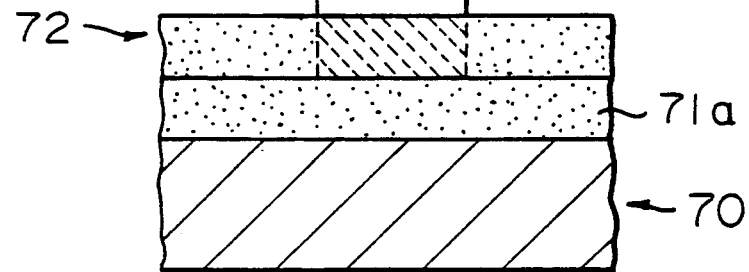
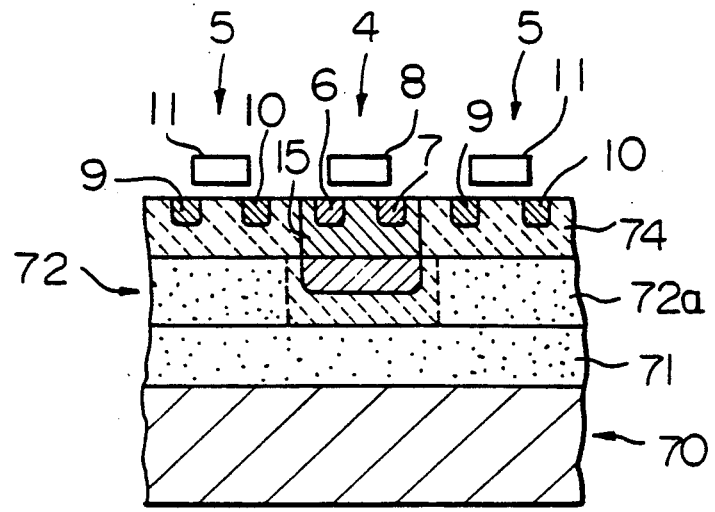

PROCESS FOR PRODUCING A SEMICONDUCTOR DEVICE WITH A BULK-DEFECT REGION HAVING A NONUNIFORM DEPTH

This is a divisional of copending application Ser. No. 06/398,384 filed on Jul. 14, 1982, now abandoned which is the parent of continuation application Ser. No. 07/777,558, filed Sep. 18, 1985; and is a continuation of application Ser. No. 07/373,591 filed Jun. 30, 1989, now U.S. Pat. No. 4,970,568.

BACKGROUND OF THE INVENTION

The present invention relates to a semiconductor device and a process for producing a semiconductor device. More specifically, the present invention relates to a semiconductor device having a novel structure and comprising a bulk-defect region and a denuded region, these regions being formed by means of an intrinsic gettering, an ion implantation, or a diffusion technique, and to a process for producing the semiconductor device.

In the art, by means of the intrinsic gettering technique, a bulk-defect region is selectively formed in a single crystalline silicon wafer produced by means of a pulling method (hereinafter referred to as a CZ wafer). The CZ wafer contains oxygen. A bulk-defect region is selectively formed by precipitating the oxygen as crystal defects in the CZ wafer. More specifically, in the intrinsic gettering technique, the CZ wafer is heat treated at a temperature of 1000° C. or higher so as to remove the oxygen contained in the surface portion of the CZ wafer due to outward diffusion of the oxygen. As a result, the surface portion of the CZ wafer has a low oxygen concentration and later becomes a denuded region. Subsequently, the CZ wafer is subjected to a heat treatment at a temperature of approximately 650° C. so as to form nuclei in the crystal in the inner part of the CZ wafer. The CZ wafer is next subjected to heat treatment at a temperature of approximately 1050° C. so as to transform the nuclei in the crystal into crystal defects. The nuclei in the crystal in the inner part of the CZ wafer are transformed into crystal defects due to the presence of oxygen in the CZ wafer. The oxygen, which is incorporated into the CZ wafer during the manufacture of the wafer, allows nuclei to form in the crystal and to later be transformed into crystal defects. Alledgedly, carbon, which is contained in the CZ wafer, precipitates during the transformation of the nuclei into crystal defects.

An example of a known semiconductor device which is produced by utilizing the intrinsic gettering technique is hereinafter described with reference to FIG. 1.

In the CMOS semiconductor device shown in FIG. 1, the CZ wafer 1 comprises a denuded region 2 at the surface portion thereof and bulk-defect region 3 at the inner portion thereof. In the CMOS, N-channel transistor 4 and P-channel transistor 5 are formed in denuded region 2, and P well 15, N+-type source region 6, N+-type drain region 7, gate electrode 8, and a gate insulating film (not shown) are the elements of the N-channel transistor 4. Similarly, P+-type source region 9, P+-type drain region 10, gate electrode 11, and a gate insulating film (not shown) are the elements of P-channel transistor 5. One of the reasons for forming the N-channel transistor 4 and the P-channel transistor 5 of the CMOS in the denuded region 2 is that contaminant substances, which may be incorporated into denuded region 2 through the surface thereof during the production of a CMOS, can be captured by the bulk-defect region 3, with the result that the properties of the N-channel transistor 4 and the P-channel transistor 5, especially the junction property, are stabilized. Another reason for forming transistors 4 and 5 is that electron-hole pairs which are generated due to α-rays are captured in bulk-defect region 3.

The present inventors studied the electrical properties of conventional CMOSs and discovered that since the distance (dp) between the bulk-defect region 3 and either the P+-type source region 9 or the P+-type drain region 10 of the CMOS is greater than the distance (dn) between the bulk-defect region 3 and the P well 15 of the CMOS, various problems result. One of the problems is that when α-rays are emitted into the CZ wafer 1, pairs of electrons (black dots) and holes (white dots), i.e., electron-hole pairs, are generated and several holes then diffuse toward the P well 15. Since the diffusion length of the electron-hole pairs is long in the denuded region 2 due to the absence of crystal defects, it is highly possible that diffusion of the holes toward the P well 15 mentioned above can generate a leakage current in the PN junction 12, which is formed between the P well 15 and the denuded region 2 which has an N-type conductivity. A leakage current can cause noise.

Hereinafter the, N-channel transistor 4 and the P-channel transistor 5 are collectively referred to as MOS transistors 4 and 5.

Another problem is that when the inversion layers 13 are formed during energization of the MOS transistors 4 and 5, electron-hole pairs are generated, due to impact ionization, in the depletion layer 14 around the N+-type drain region 7 or the P+-type drain region 10. The electrons and/or holes then move toward the surface of the CZ wafer 1. During this movement, no recombination of the holes and electrons occurs in the bulk-defect region 3 due to the fact that dp>dn. Instead, a flow of holes into the P well 15 occurs, causing the potential of the P well 15 to increase, and, as a result, a leakage current can be generated in the PN junction 12. The generation of a leakage current becomes serious when the MOS transistors 4 and 5 are miniaturized, and a so-called latch up frequently occurs during energization of the CMOS. Reference numeral 14 indicates schematically the depletion layers which are formed around the sources and drains of the MOS transistors 4 and 5 due to the PN junctions, which are not numbered.

The present inventors generally noted the following points concerning a conventional semiconductor device: 1) In a conventional semiconductor device, at least two semiconductor elements have a nonuniform depth when measured from the surface of the semiconductor substrate and the denuded region and the bulk-defect region of the semiconductor device have a uniform depth when measured from the surface of the semiconductor substrate; 2) For this reason, a leakage current can be generated in the PN junction of a semiconductor device; 3) Due to the possible generation of a leakage current, the information holding time is shortened and refresh failure results for a dynamic memory semiconductor device and; 4) Due to the leakage current, isolation of the semiconductor elements becomes incomplete for a bipolar semiconductor integrated circuit device when the device is highly integrated.

SUMMARY OF THE INVENTION

It is an object of the present invention to provide a semiconductor device having a structure capable of eliminating problems such as the generation of a leakage current, the occurrence of latch-up, and the occurrence of refresh failure, as well as incomplete isolation of the semiconductor elements. These problems result due to the fact that in a conventional semiconductor device comprising at least two semiconductor elements having a nonuniform depth as measured from the surface of the semiconductor substrate and the denuded region and the bulk-defect region have a uniform depth when measured from the surface of the semiconductor substrate.

It is another object of the present invention to provide a process for producing a semiconductor device having the structure mentioned above.

In accordance with the objects of the present invention, there is provided a semiconductor device comprising a semiconductor substrate; in which is formed a plurality of semiconductor elements having a nonuniform depth when measured from the surface of the semiconductor substrate. The semiconductor substrate has a bulk-defect region having a nonuniform depth as measured from the surface of the semiconductor substrate, this depth corresponds to the nonuniform depth of the semiconductor elements. The depth measured from the surface of the semiconductor substrate is hereinafter simply referred to as the depth.

Any one of the plurality of semiconductor elements comprises, generally speaking, a first region of a pair of regions having a first conductivity type different from that of a second region of the pair having a second conductivity type and forming a PN junction, i.e., a fundamental element of a semiconductor device. In an ordinary semiconductor device, a plurality of pairs of the regions are functionally combined so as to produce active or passive semiconductor elements. The bulk-defect region of the present invention has, therefore, a depth which is nonuniform in accordance with the depth of the active or passive semiconductor elements. In addition, since the electrical properties of a semiconductor device being energized are most influenced by the active region, in which the carriers flow from one or more of the semiconductor elements, e.g., the passive or active semiconductor elements, the bulk-defect region of the present invention preferably has a depth which is nonuniform in accordance with the depth of the active region. The depth of the bulk-defect region is preferably determined in accordance with the depth of a depletion layer which is formed around the passive or active semiconductor elements. Specifically, in the case of a bipolar semiconductor integrated circuit device, all of the bipolar transistors (active semiconductor elements) are isolated from each other by isolation regions which are inactive. In this case, the bulk-defect region of the present invention preferably has a depth which is nonuniform in accordance with the depth of the bipolar transistors and the isolation regions.

A process for producing a semiconductor device comprising a semiconductor substrate, in which is formed a plurality of semiconductor elements having a nonuniform depth, comprises a step for selectively forming a bulk-defect region having a high oxygen concentration and a nonuniform depth, preferably by means of the intrinsic gettering technique or the ion implantation or diffusion technique. The bulk-defect region has a nonuniform depth in accordance with the depth of the semiconductor elements.

The intrinsic gettering technique is used to selectively form in a semiconductor substrate comprising a CZ wafer, a bulk-defect region. In a case where a semiconductor substrate comprises a single crystalline semiconductor wafer produced by a floating zone method (hereinafter referred to as an FZ wafer), the ion implantation or diffusion technique is used to selectively form a bulk-defect region since the FZ wafer has a low concentration of oxygen and oxygen must be incorporated into the FZ wafer.

BRIEF DESCRIPTION OF THE DRAWINGS

FIGS. 5 through 8 are processes for producing a semiconductor device according to the present invention.

DESCRIPTION OF THE PREFERRED EMBODIMENTS

Figure 2:
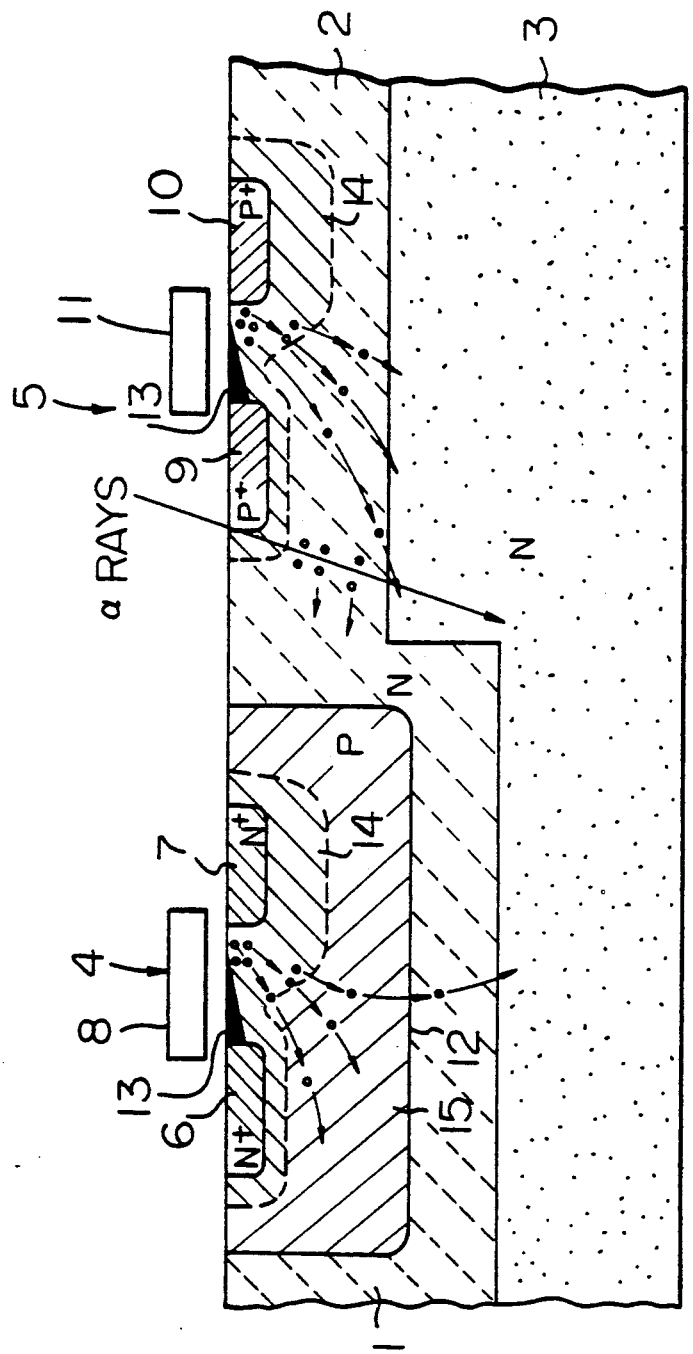
FIG. 2 is a CMOS device according to the present invention.

In FIG. 2, a CMOS of the present invention is shown. A CMOS usually comprises a P well or an N well, and in FIG. 2, a CMOS comprising a P well 15 is shown. The semiconductor elements are an N-channel transistor 4 and a P-channel transistor 5. The depth of the N-channel transistor 4 is determined by the depth of the P well 15 while the depth of the P-channel transistor 5 is essentially determined by the depth of the P+-type source region 9 and P+-type drain region 10. The depth of bulk-defect region 3 is therefore large beneath the N-channel transistor 4 and small beneath the P-channel transistor 5. As a result of such nonuniform depth of the bulk-defect region 3, the electron-hole pairs, which may be generated in the denuded region 2 by the impact of the emitted α-rays, can be effectively captured in bulk-defect region 3, and recombination of the electron-hole pairs effectively occurs in the bulk-defect region 3. The electrons which may be generated due to impact ionization can also be effectively captured in the bulk-defect region 3. Therefore, it is possible to prevent the occurrence of latch-up and the generation of a leakage current in the PN junction 12.

The electrical import of the depth of the semiconductor elements, such as the P-channel transistor 5, is determined based on the depth of the depletion layer 14 formed around the P-channel transistor 5. The depth determined by the depletion layer 14 is hereinafter referred to as the effective depth. The depth of the bulk-defect region 3 below the semiconductor elements, such as the P-channel transistor 5, is preferably determined in accordance with the effective depth of, for example, the P-channel transistor 5.

Figure 3:
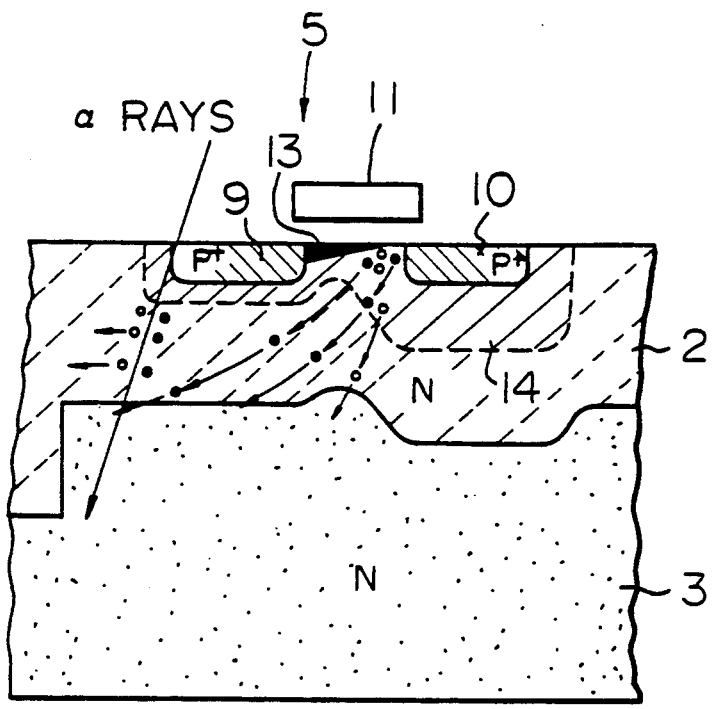
FIGS. 3 and 4 are conventional MOS transistors.

An example of the bulk-defect region 3, the depth of which is determined in accordance with the effective depth of the P-channel transistor 5, is shown in FIG. 3. The bulk-defect region 3 is shallow and deep beneath the P+-type source region 9 and the P+-type drain region 10, respectively, of the P-channel transistor 5.

Figure 4:
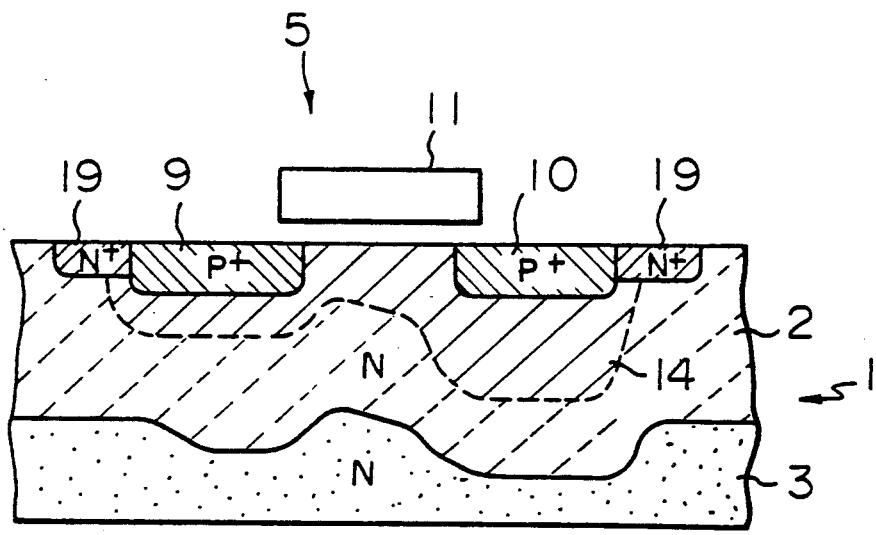

In FIG. 4, the P-channel transistor 5 is provided with the N+-type isolation region 19. The depth of the bulk-defect region 3 is determined in accordance with the effective depth of the P-channel transistor 5 and the depth of the N+-type isolation region 19.

As can be understood from the descriptions hereinabove, determination of the depth of the bulk-defect region in accordance with the depth or effective depth of the semiconductor elements involves a concept in which, as seen in a cross-section of a semiconductor device, the bulk-defect region is provided with an upper profile which is substantially the same as the lower profile of the semiconductor elements. Preferably, the distance between the bulk-defect region and the depletion layer is determined so that the distance between the bulk-defect region and the deepest portion of the depletion layer is from 2 to 30 microns, the deepest portion of the depletion layer range implying that the depletion layer spreads when a predetermined voltage is applied to the semiconductor elements.

The precipitation of crystal defects can be achieved not only by means of the intrinsic gettering technique but also by means of the ion implantation or diffusion technique. The concentration of oxygen in a CZ or FZ wafer necessary for precipitation is desirably approximately $1.6 \times 10^{18}/cm^3$.

The bulk-defect region of the present invention can be used in any bipolar or MOS semiconductor integrated circuit device. In any case, the bulk-defect region does not protrude through the PN junction of the device.

Embodiments of the process according to the present invention are hereinafter described.

In FIGS. 5 and 6, the intrinsic gettering technique is utilized to produce a CMOS device and a bipolar semiconductor integrated circuit device, respectively. In FIG. 7, an ion implantation or diffusion technique is utilized to produce a CMOS semiconductor device, and in FIG. 8, the intrinsic gettering technique and an epitaxial growth technique are utilized to produce a semiconductor device.

In FIGS. 5A through 5G, a semiconductor device, i.e., a CMOS, is produced by means of a process according to the present invention. The $N^-$-type silicon substrate 21 comprises a CZ wafer and is subjected to conventional thermal oxidation so as to form a first silicon dioxide film 22 having a thickness of, for example, from 500 Å to 600 Å. The $N^-$-type silicon substrate 21 is then heat treated at a temperature of from 1050° C. to 1150° C. for a 10-minute period within a non-oxidizing atmosphere, such as a nitrogen atmosphere, so as to diffuse out an impurity, such as oxygen, contained in the surface portion of the $N^-$-type silicon substrate 21. The above-mentioned heat treatment at a temperature of from 1050° C. to 1100° C. is hereinafter referred to as a first high-temperature treatment. As a result of the first high-temperature treatment, the low oxygen concentration region, which later becomes a first denuded region 23, is formed beneath the first silicon dioxide film 22 and has a thickness of approximately 8 microns.

Subsequently, silicon nitride film 25 (FIG. 5B) is formed by means of a conventional chemical vapor deposition (CVD) method on the first silicon dioxide film 22, which is formed on the $N^-$-type silicon substrate 21, and is then delineated by means of a conventional photoetching method. The silicon nitride film 25 has a thickness preferably of from 1000 Å to 2000 Å so that it is highly resistant to oxidation. As a result of delineation of the silicon nitride film 25, the window 24 selectively exposes the first silicon dioxide film 22, and a P well (not shown) is formed beneath film 22. After the delineation of the silicon nitride film, the $N^-$-type silicon substrate 21 is heat treated at a temperature of from 1050° C. to 1150° C. for a few hours within a non-oxidizing atmosphere so as to diffuse out an impurity, such as oxygen, contained in $N^-$-type silicon substrate 21. This heat treatment is hereinafter referred to as a second high-temperature treatment. As a result of the second high-temperature treatment, a low oxygen concentration region, which later becomes second denuded region 26, having a depth of, for example, 15 microns is formed.

Subsequently, the $N^-$-type silicon substrate 21 (FIG. 5C) is heat treated at a temperature which is lower than that of the first and second high-temperature treatments, for example, from 550° C. to 900° C., for an optional period of time. This heat treatment is hereinafter referred to as a low-temperature treatment. As a result of the low-temperature treatment, excess oxygen, which is contained in a portion of the $N^-$-type silicon substrate 21 other than low oxygen concentration regions which later become first and second denuded regions 23 and 26, respectively, is coagulated and precipitated. A bulk-defect region 27, which is contiguous to the first and second denuded regions 23 and 26, respectively, is formed.

The silicon nitride film 25 (FIG. 5C) is then selectively removed and thermal oxidation is carried out at a temperature, for example, 900° C. lower than the first and second high-temperature treatments so as to form on the $N^-$-type silicon substrate 21 a second silicon dioxide film 28 (FIG. 5D) having a thickness of, for example, 5000 Å. A window 29 is provided for a; P well diffusion region which is formed by means of a conventional photoetching method through the second silicon dioxide film 28. A P-type impurity is diffused through the window 29 into the P well diffusion region by means of a conventional gas diffusion method or the like so as to form in the second denuded region 26 a P well 30 having a predetermined impurity concentration. The P well 30 is adjacent to the bulk-defect region 27 but with a distance ($d_1$) of 5 to 6 microns maintained between the boundary surfaces of the P well 30 and the bulk-defect region 27.

Figure 5A:
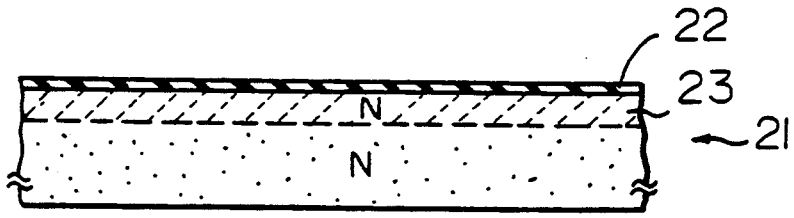
Figure 5B:
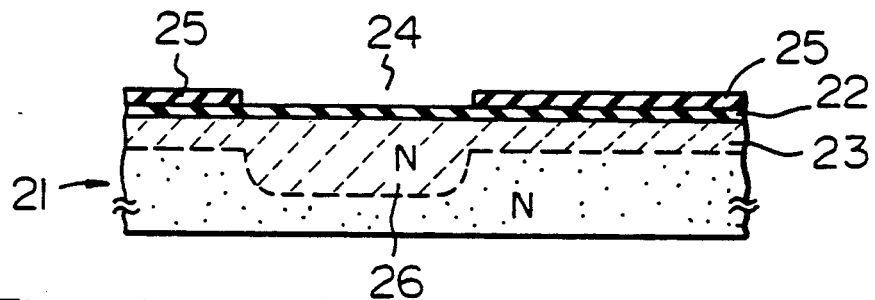
Figure 5C:
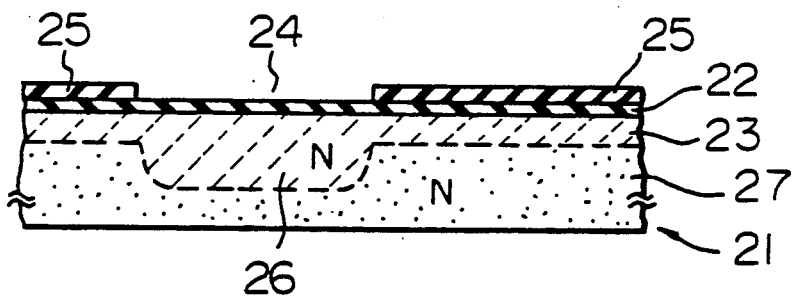
Figure 5D:
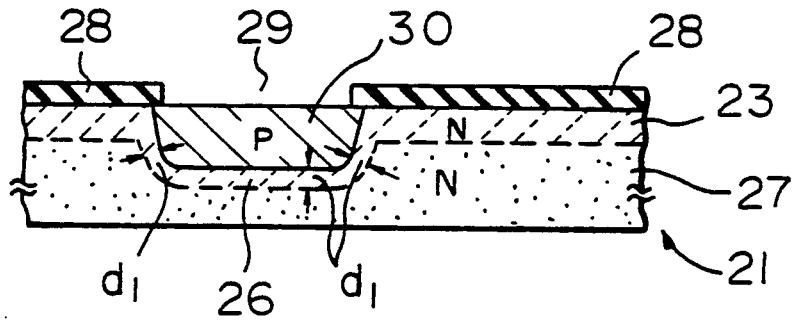
Figure 5E:
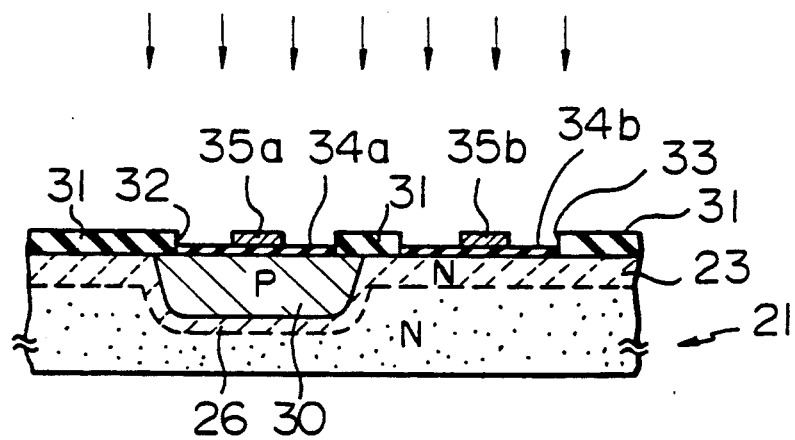
Figure 5F:
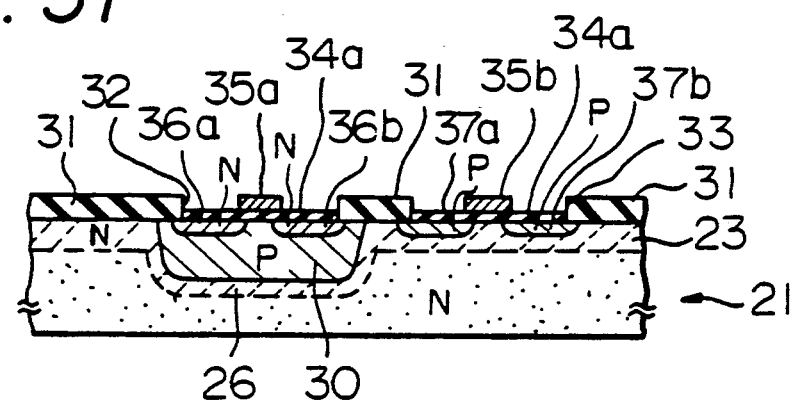
Figure 5G:
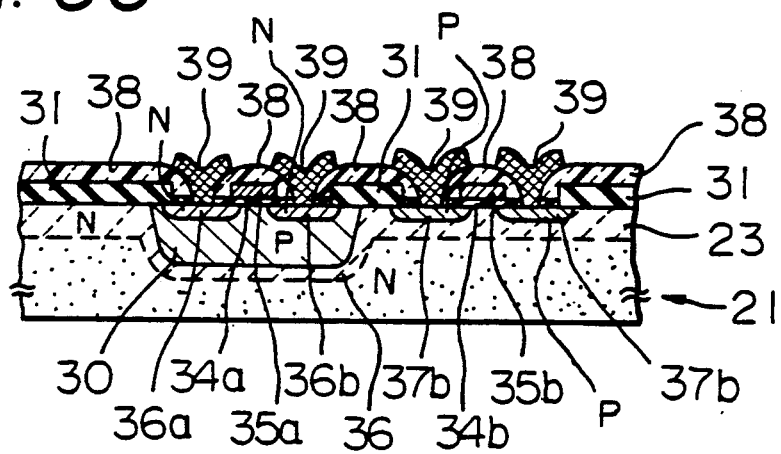

The following steps illustrated in FIGS. 5E through 5G are carried out in accordance with a conventional process for producing a CMOS.

In FIG. 5E, after removing the second silicon dioxide film 28 (not shown), which is formed on the $N^-$-type silicon substrate 21, a third silicon dioxide film 31 having a thickness of, for example, 5000 Å is formed on the $N^-$-type silicon substrate 21, by means of a conventional thermal oxidation method, at a temperature of 900° C. or lower. A window 32 for producing an N-channel transistor and a window 33 for producing a P-channel transistor are formed through the third silicon dioxide film 31. Gate oxide films 34a and 34b are formed on the exposed P well 30 and the exposed $N^-$-type silicon substrate 21, respectively, by means of a conventional thermal oxidation method. The thickness of the gate oxide films 34a and 34b is on the order of 100 Å. Polycrystalline silicon gate electrodes 35a and 35b are then formed on the gate oxide films 34a and 34b, respectively, by depositing on the films 34a and 34b a polycrystalline silicon layer having a thickness of approximately 3000 Å to 4000 Å and then delineating the polycrystalline silicon layer. Deposition and delineation of the polycrystalline silicon layer are carried out by a CVD method and a photoetching method, respectively. A photoresist film (not shown) is then applied over the window 33 to produce an N-channel transistor. While the photoresist film is being applied, an N-type impurity, for example, arsenic, in diffused or ion implanted into portions of the P well 30, which are not covered by the polycrystalline silicon gate electrode 35a, so that the diffusion or ion implantation depth becomes, for example, from 2000 Å to 3000 Å. Subsequently, a photoresist film (not shown) is applied over the window 32 for producing a P-channel transistor. While this photoresist film is being applied, a P-type impurity, for example, boron, is diffused or ion implanted into portions of the N-type silicon substrate 21, which are not covered by the polycrystalline silicon gate electrode 35b, so that the diffusion or ion implantation depth becomes, for example, from 2000 Å to 3000 Å. In the case of ion implantation, the impurity is activated by heat treatment at a temperature of approximately 950° C. As a result of the diffusion or ion implantation described hereinabove, an N-type source region 36a and an N-type drain region 36b, respectively, of an N-channel transistor are formed in the P well 30 while a P-type source region 37a and P-type drain region 37b, respectively, of a P-channel transistor are formed in the first denuded region 23. The PN junctions between the N$^-$-type silicon substrate 21 and the P-type source region 37a and P-type drain region 37b, respectively, are formed in the first denuded region 23.

In FIG. 5G, the production of a CMOS is completed by successively forming an insulating film 38 comprising phosphosilicate glass (PSG), opening windows through insulating film 38, and forming electrodes and conductors 39 comprising aluminum.

In FIGS. 6A through 6G, a bipolar semiconductor integrated circuit device, i.e., an NPN-type bipolar transistor, is produced by means of an embodiment of the process according to the present invention.

Figure 6A:
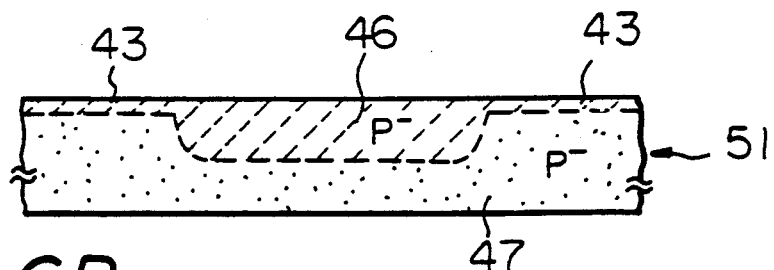
Figure 6B:
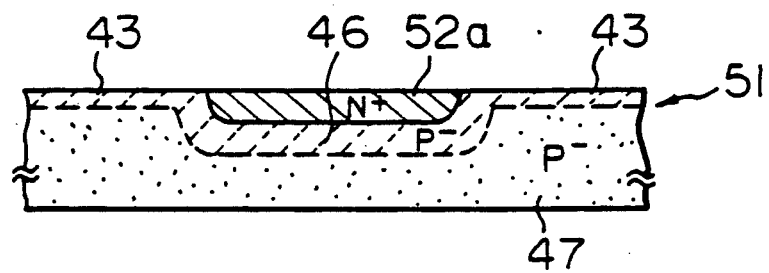
Figure 6C:
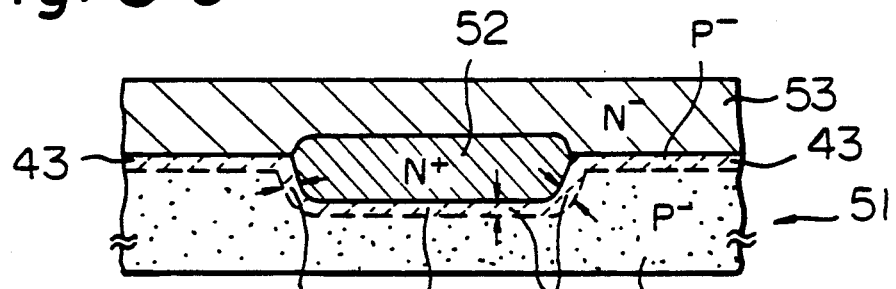

First, as is illustrated in FIGS. 6A through 6C, a first denuded region 43 having a depth of, for example, from 3 to 4 microns and a second denuded region 46 having a depth of, for example, 10 microns are formed in a P$^-$-type silicon substrate 51. In addition, the bulk-defect region 47, which is contiguous to the first and second denuded regions 43 and 46, respectively, is formed in the P$^-$-type silicon substrate 51. The lateral dimension of the second denuded region 46 is determined so that an N$^+$-type buried collector region 52 (FIGS. 6C through 6G) is formed in the second denuded region 46. The steps illustrated in FIGS. 6B through 6G are carried out in accordance with a conventional process for producing an NPN-type bipolar transistor.

In FIG. 6B, an N-type impurity, such as arsenic or antimony, is selectively diffused or is ion implanted in the second denuded region 46 so as to a form N$^+$-type region 52a. Subsequently, an N$^-$-type epitaxial silicon layer 53 (FIG. 6C) having a thickness of 5 to 6 microns is formed on the P$^-$-type silicon substrate so that the N$^+$-type region 52a is covered by the N$^-$-type epitaxial silicon layer 53. Since the epitaxial growth of the N$^-$-type epitaxial silicon layer 53 is carried out at a high temperature of approximately 1100° C. to 1150° C., an N$^+$-type buried collector region 52 is formed due to upward diffusion of the impurity from the N$^+$-type region 52a. The N$^+$-type buried collector region 52 is preferably separated from the bulk-defect region 47 so that the distance (d$_2$) of the PN junction, located between the P$^-$-type silicon substrate 51 and the N$^+$-type buried collector region 52, from the top surface of bulk-defect region 47 is from 5 to 6 microns. This distance can be ensured by appropriately determining the depth of the N$^+$-type region 52a (FIG. 6B).

Figure 6D:
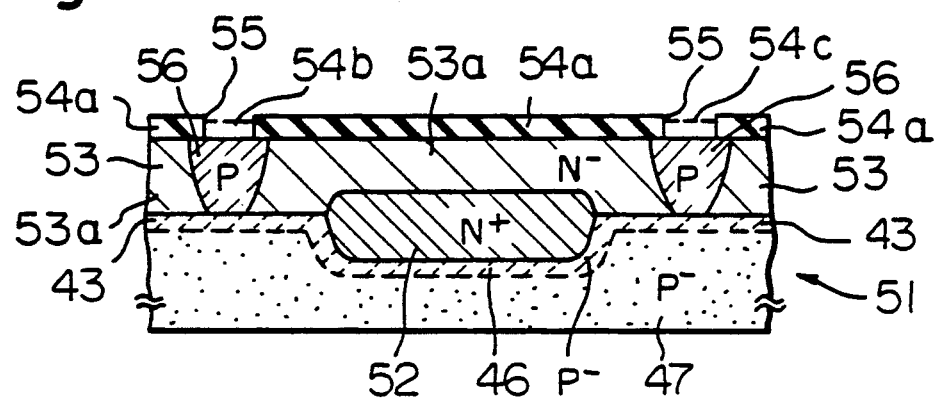
Figure 6E:
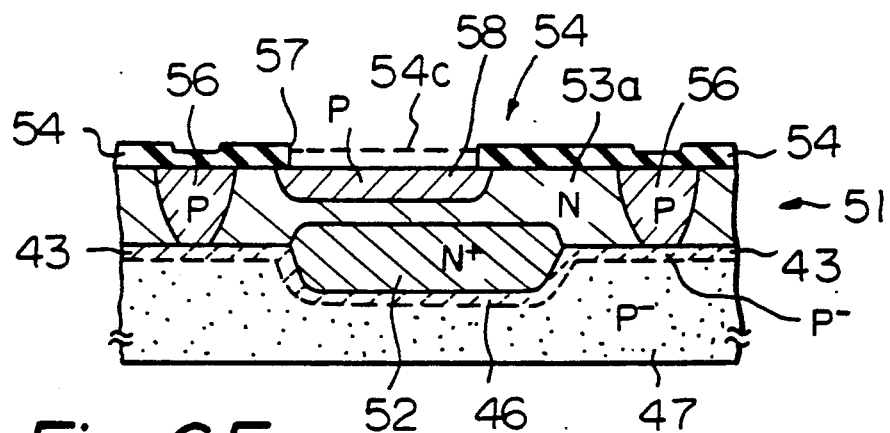
Figure 6F:
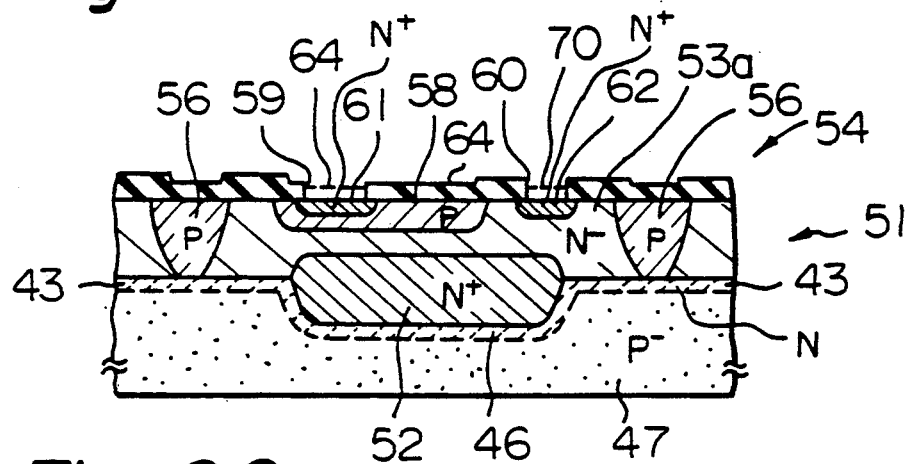
Figure 6G:
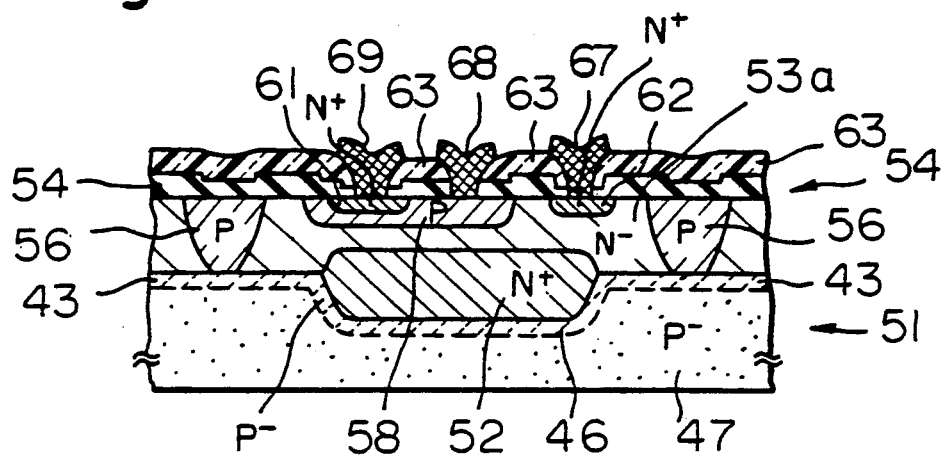

In FIG. 6D, a silicon dioxide film 54 is formed on the N$^-$-type epitaxial silicon layer 53 by means of a conventional method, and windows 55 for producing isolation regions are formed through the silicon dioxide film 54a. Through windows 55, a P-type impurity, for example, boron, is diffused by means of a conventional gas diffusion method so as to form P$^+$-type isolation regions 56 in the N$^-$-type epitaxial silicon layer 53, the regions 56 define and isolate a plurality of N$^-$-type collector regions 53a from each other. During the formation of the P$^+$-type isolation regions 56, silicon dioxide films 54b and 54c are formed in the P$^+$-type isolation regions 56.

A window 57 (FIG. 6E) for base diffusion is formed through the silicon dioxide film 54a by means of a conventional photoetching method. A P-type impurity, for example, boron, is diffused through the window 57 for base diffusion by means of a conventional gas diffusion method so as to form in the N$^-$-type collector regions 53a, P-type base regions 58 having a predetermined depth and impurity concentration while the silicon dioxide film 54c is formed in each of the P-type base regions 58.

A window 59 for emitter diffusion and a window 60 for collector-contact diffusion are formed through the silicon dioxide films denoted collectively by 54 by means of a conventional photoetching method. An N-type impurity, for example, phosphorus or arsenic, is introduced through the windows 59 and 60 by means of a conventional gas diffusion method or the conventional ion implantation technique, followed by the activation of phosphorus or arsenic, so as to form an N$^+$-type emitter region 61 in each of the P-type base regions 58 and an N$^+$-type collector-contact region 62 in each of the N$^-$-type collector regions 53a. During the formation of the N$^+$-type emitter region 61 and the N$^+$-type collector-contact region 62, a silicon dioxide film 64 is formed in each of these regions.

Passivation film 63 comprising phosphosilicate glass (PSG) is formed on the P$^-$-type silicon substrate 51 and then windows (not shown) for producing the collector, base and emitter electrodes are formed through the passivation film 63. The collector electrode and conductor 67, the base-electrode and conductor 68, and the emitter-electrode and conductor 69 are then formed in such a manner that an end of each of these electrodes and conductors is positioned in each of the windows (not shown) mentioned above.

In FIGS. 7A through 7D, a CMOS having a nonuniform deep bulk-defect region is produced by an embodiment of the process of the present invention, in which the ion implantation or diffusion technique is utilized. On the surface portion of FZ wafer 70 (FIG. 7A), a high-oxygen concentration region 71 is formed by means of the ion implantation or diffusion technique. The high-oxygen concentration region 71 preferably has a thickness of 5 to 10 microns and an oxygen concentration of 1.4 to $1.9 \times 10^{18}$/cm$^3$.

Figure 1:
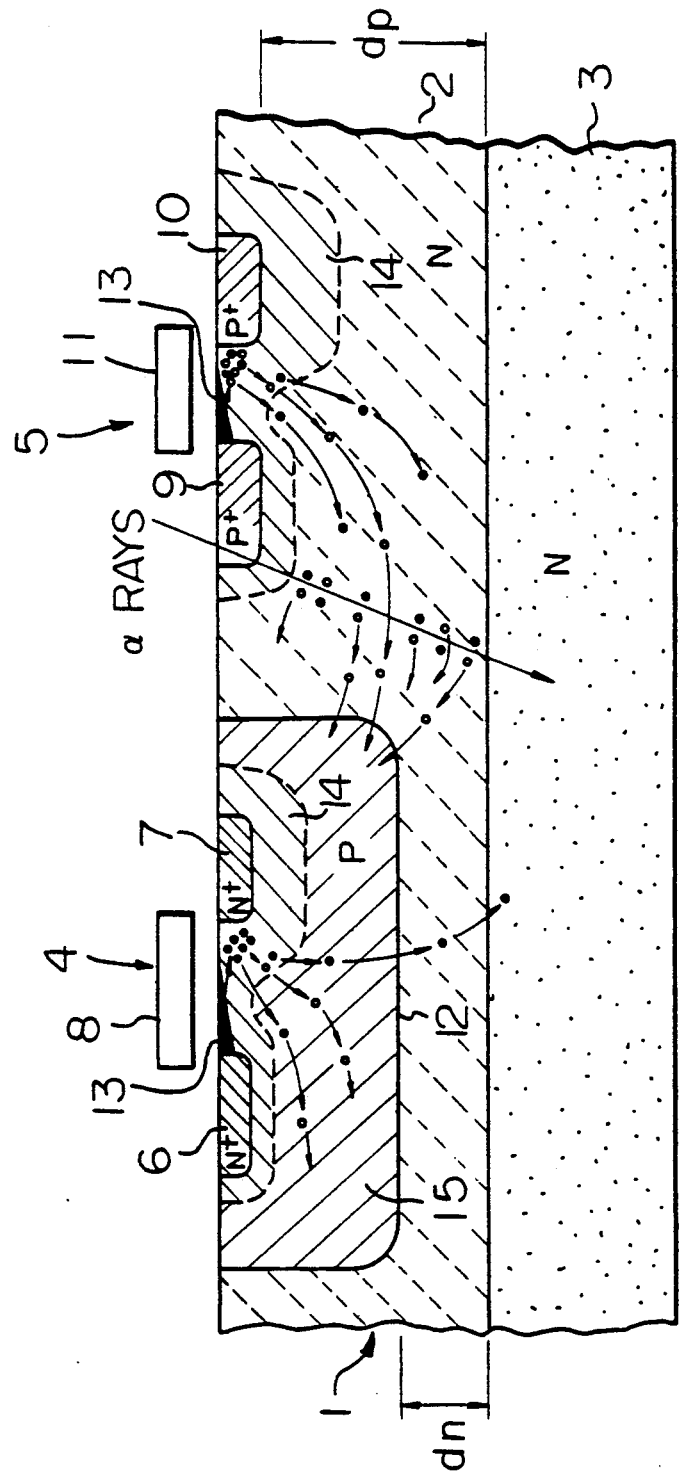
FIG. 1 is a conventional complementary metal-oxide semiconductor (CMOS) device.

An epitaxial silicon layer 72 (FIG. 7B) having a thickness of 7 to 8 microns is formed on the high-oxygen concentration region 71. A photoresist film 73 (FIG. 7C) is then selectively formed on the epitaxial silicon layer 72 and a high-oxygen concentration epitaxial silicon region 72a is selectively formed by means of the ion implantation technique. Also, the oxygen may be selectively diffused to form the high-oxygen concentration epitaxial silicon region 72a. Subsequently, heat treatment is carried out at a temperature of 550° C. to 900° C. so as to precipitate the oxygen as crystal defects. As a result of the precipitation of oxygen, high-oxygen concentration region 71 is converted to a bulk-defect region 71a, and in the epitaxial silicon layer 72 a bulk-defect region which is also denoted by 72a is selectively formed. Therefore, the bulk-defect regions 71a and 72a having a nonuniform depth are formed. Subsequently, an epitaxial silicon layer 74 having a thickness of 7 to 8 microns is formed on the epitaxial silicon layer 72. The known procedures for the production of a CMOS are then carried out so that a CMOS (FIG. 7D), the parts of which are denoted by the same reference numerals as in FIGS. 1 and 2, is obtained.

Figure 8A:
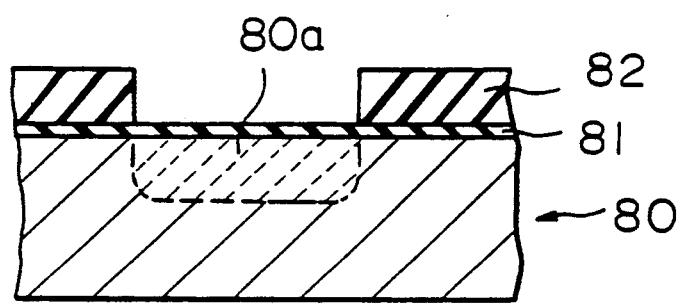
Figure 8B:
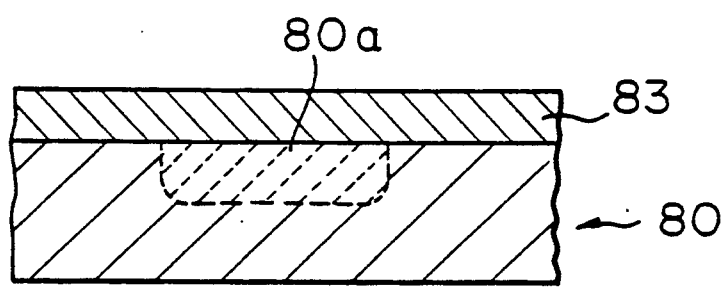

In FIG. 8A, a silicon dioxide film 81 and a silicon nitride film 82 are successively formed on the CZ wafer 80 and a heat treatment is then carried out at a temperature from 1050° C. to 1150° C. so as to selectively diffuse out the oxygen contained in the CZ wafer 80 and thus forms a low-oxygen concentration region 80a. Epitaxial silicon layer 83 (FIG. 8B) having a thickness from 7 to 8 microns is formed on the CZ wafer 80. Subsequently, a heat treatment is carried out at a temperature from 550° C. to 900° C. so as to form a bulk-defect region 80b. The procedures illustrated in FIGS. 5 or 6 are then carried out so that a CMOS or an NPN transistor is produced.

Figure 8C:
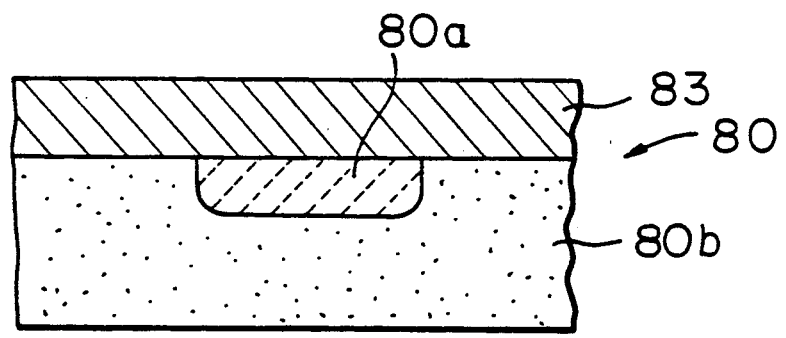

As shown in FIGS. 6 through 8, when ion implantation or diffusion is carried out twice, the bulk-defect layer has two different depths. Therefore, when ion implantation or diffusion is carried out three or more times, the bulk-defect layer has three or more different depths.

We claim:

1. A process for producing a semiconductor device comprising a semiconductor material substrate in which are formed semiconductor elements having a depth which is non-uniform when measured from the surface of the semiconductor substrate, said process comprising the steps of:
   (a) forming a bulk-defect region having a high-oxygen concentration and a non-uniform upper face measured from the surface of the semiconductor substrate, in the entire semiconductor substrate, the non-uniform upper face of the bulk-defect region comprising a first upper face portion having a first depth and a second upper face portion having a second depth deeper than the first depth; and
   (b) forming the semiconductor elements in a defect-free region having low oxygen concentration and existing on the bulk-defect region and in the entire semiconductor substrate, by forming a first doped region having a third depth measured from the surface of the semiconductor substrate and facing the first upper face portion and forming a second doped region having a fourth depth deeper than the third depth and facing the second upper face portion.

2. A process for producing a semiconductor device according to claim 1, wherein the semiconductor substrate comprises a CZ wafer and wherein said step (a) for entirely forming the bulk-defect region comprises a sub-step of diffusing oxygen out of the CZ wafer by a high temperature heat treatment.

3. A process for producing a semiconductor device according to claim 2 wherein said oxygen diffusion is carried out using a mask comprising a nitride film, for selectively exposing a portion of the CZ wafer corresponding to the second upper face portion.

4. A process for producing a semiconductor device according to claim 1, wherein the semiconductor substrate comprises an FZ wafer and wherein said step (a) for entirely forming the bulk-defect region comprises the sub-step of ion implanting oxygen into the FZ wafer.

5. A process for producing a semiconductor device according to claim 1, wherein the semiconductor substrate comprises and FZ wafer and wherein said step (a) for entirely forming the bulk-defect region comprises the sub-step of diffusing oxygen into the FZ wafer.

6. A process for producing a semiconductor device according to claim 1, further comprising the steps of:
   (c) forming a first high-oxygen concentration region in a surface portion of the semiconductor substrate of an FZ wafer by introducing oxygen from the surface of the FZ wafer;
   (d) forming a first single crystalline semiconductor layer on the FZ wafer;
   (e) selectively forming a second high-oxygen concentration region in the first single crystalline layer by ion-implanting oxygen into a portion of the first single crystalline layer which is not covered by a mask film;
   (f) converting the first and second high-oxygen concentration regions into the bulk-defect region having the nonuniform upper face; and
   (g) forming a second single crystalline semiconductor layer on the first single crystalline semiconductor layer.

7. A process for producing a semiconductor device according to claim 1, further comprising the steps of:
   (c) forming a mask film, having a window, on the semiconductor substrate of a CZ wafer;
   (d) selectively forming a defect-free region in a surface portion of the CZ wafer by annealing the CZ wafer at a first high temperature;
   (e) forming a single crystalline semiconductor layer on the CZ wafer; and
   (f) forming the bulk-defect region in the CZ wafer except at the defect-free region by annealing the semiconductor substrate at a second temperature lower than the first temperature.

8. A process for producing a semiconductor device comprising a semiconductor material substrate in which are formed semiconductor elements having a depth which is non-uniform when measured from the surface of the semiconductor substrate, said process comprising the steps of:
   (a) forming a first defect-free region, having a first depth measured from the surface of the semiconductor substrate, in the semiconductor substrate by annealing the semiconductor substrate at a first high temperature;
   (b) forming a mask film, having a window, on the semiconductor substrate;
   (c) forming a second defect-free region, having a second depth deeper than the first depth, in the semiconductor substrate and below the window, by annealing the semiconductor substrate at a second high temperature; and
   (d) forming a bulk-defect region in the semiconductor substrate under the first and second defect-free regions by annealing the semiconductor substrate at a third temperature lower than the first and second temperatures.

9. A method for producing a semiconductor device having a silicon substrate of a first conductivity type, comprising the steps of:
   (a) forming a first silicon dioxide film on the silicon substrate by heating the silicon substrate to a first high temperature;
   (b) forming a first denuded region in the silicon substrate;
   (c) forming a silicon nitride film on the first silicon dioxide film;
   (d) selectively etching the silicon nitride film to expose the first silicon dioxide film;
   (e) forming a second denuded region in the silicon substrate by heating the silicon substrate to a second high temperature to form the second denuded region;
   (f) forming a bulk-defect region in the silicon substrate by heating the silicon substrate to a low temperature, the low temperature being lower than the first and second high temperatures;
   (g) selectively removing and oxidizing the silicon nitride film to form a second silicon dioxide film on the first denuded region; and
   (h) etching a window in the second silicon dioxide film and diffusing impurities through the window to form a well of the second conductivity type in the first denuded region extending into the second denuded region and adjacent to the bulk-defect region.

* * * * *